US008702871B2

(12) United States Patent
Hsiao et al.

(10) Patent No.: US 8,702,871 B2
(45) Date of Patent: Apr. 22, 2014

(54) PACKAGE ASSEMBLY CLEANING PROCESS USING VAPORIZED SOLVENT

(75) Inventors: Yi-Li Hsiao, Hsin-Chu (TW); Bor-Ping Jang, Chu-Bei (TW); Kuei-Wei Huang, Hsin-Chu (TW); Lin-Wei Wang, Zhubei (TW); Chien Ling Hwang, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 274 days.

(21) Appl. No.: 13/221,673

(22) Filed: Aug. 30, 2011

(65) Prior Publication Data

US 2013/0048027 A1    Feb. 28, 2013

(51) Int. Cl.
*B08B 3/00* (2006.01)
*B08B 5/00* (2006.01)

(52) U.S. Cl.
USPC ............... 134/31; 134/25.4; 134/26; 134/30

(58) Field of Classification Search
None
See application file for complete search history.

(56) References Cited

U.S. PATENT DOCUMENTS

| 3,084,076 | A * | 4/1963 | Loucks et al. | 134/22.1 |
| 6,558,477 | B1 * | 5/2003 | Scovell | 134/30 |
| 2006/0237032 | A1 * | 10/2006 | Cheng | 134/2 |
| 2009/0007934 | A1 * | 1/2009 | Hutto | 134/2 |
| 2009/0029560 | A1 * | 1/2009 | Hansen et al. | 438/745 |
| 2009/0101186 | A1 * | 4/2009 | Hiroshiro et al. | 134/56 R |

OTHER PUBLICATIONS http://www.wellango.com/en/Other-Products-oxid/Respiratory-Therapy/OMRON-NE-U17.html, Wellango, The European Health Supplier, OMRON NE-U17, 2 pgs.

* cited by examiner

*Primary Examiner* — Nicole Blan
(74) *Attorney, Agent, or Firm* — Slater & Matsil, L.L.P.

(57) ABSTRACT

A method includes generating a solvent-containing vapor that contains a solvent. The solvent-containing vapor is conducted to a package assembly to clean the package assembly. The solvent-containing vapor condenses to form a liquid on a surface of the package assembly, and flows off from the surface of the package assembly.

17 Claims, 8 Drawing Sheets

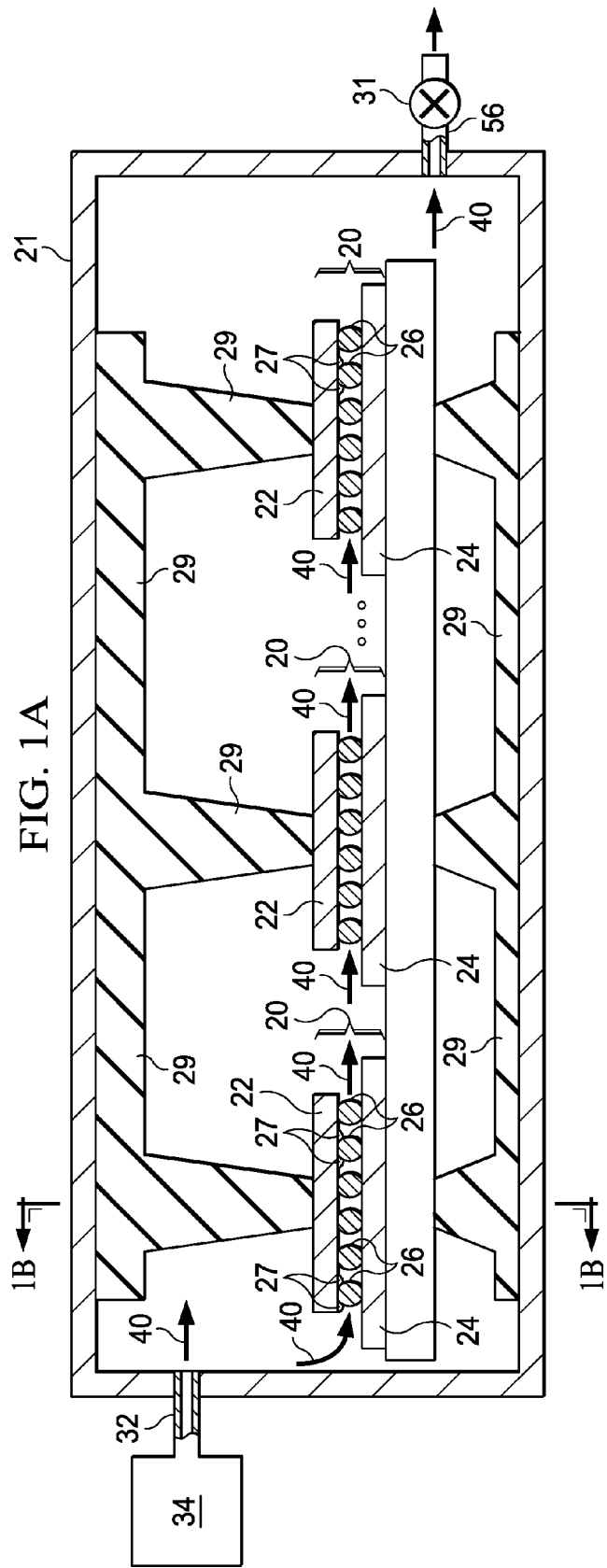

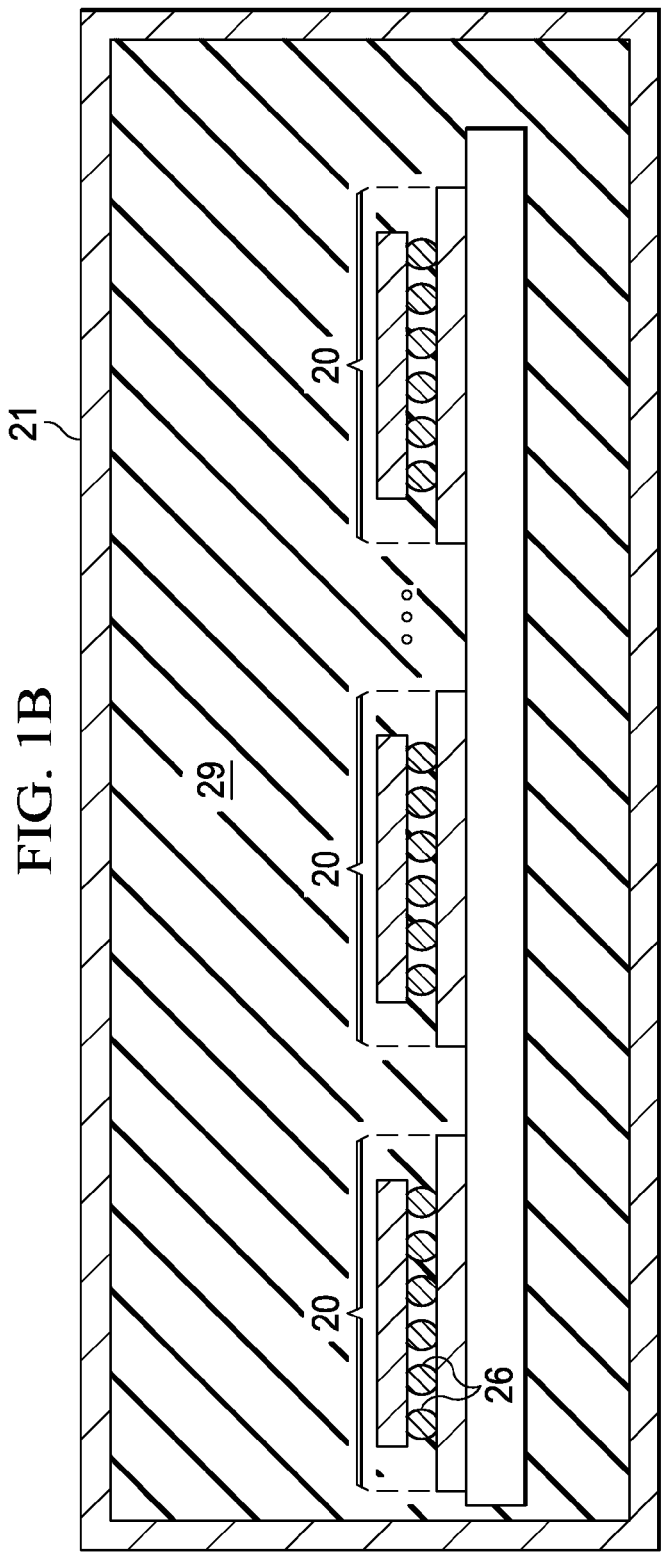

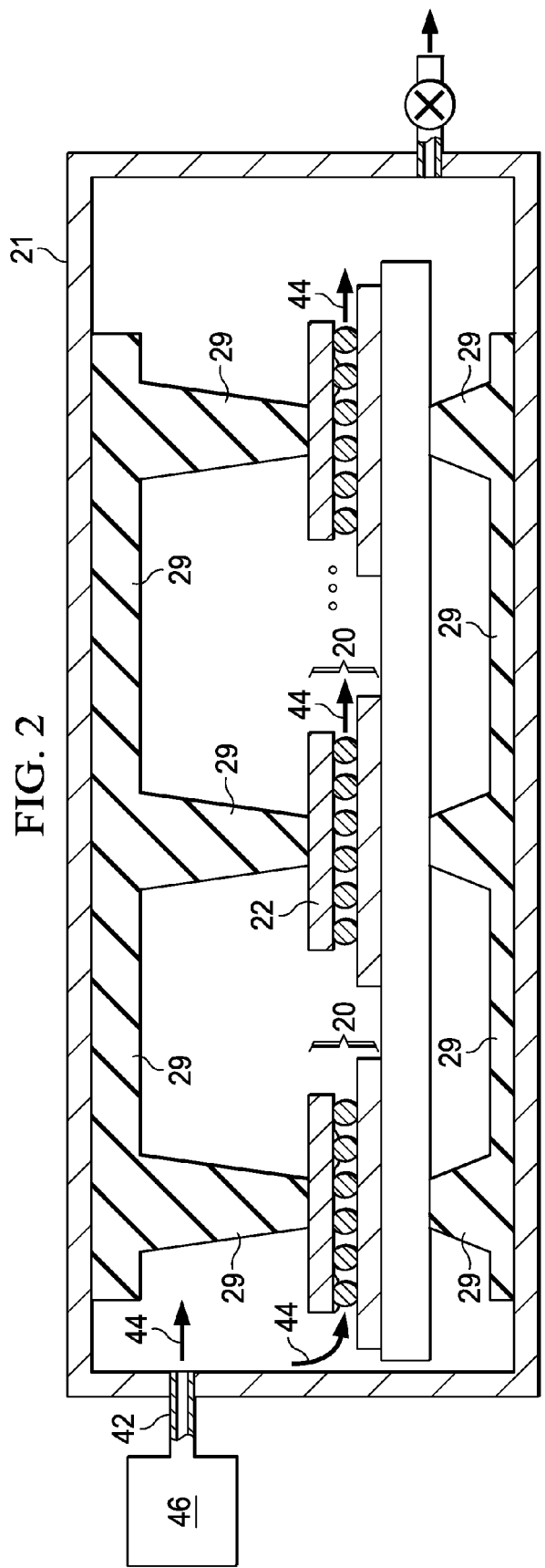

… (1)

PACKAGE ASSEMBLY CLEANING PROCESS USING VAPORIZED SOLVENT

BACKGROUND

In the packaging of integrated circuits, device dies may be bonded to package components such as additional device dies, interposers, package substrates, printed circuit boards (PCBs), or the like. Solder balls are commonly used for bonding the device dies to the package components. In a typical bonding process, solder flux is applied on the surfaces of bonding features, followed by a reflow to melt solder.

With the increasing down-scaling of integrated circuits, the pitches of the solder balls become increasingly smaller. For example, the pitches of solder balls/bumps may be as small as 140 μm for solder ball/bump arrays, or even smaller for peripheral solder ball/bumps that are located close to the peripheral of the device dies. This causes difficulty for package assembly cleaning processes. For example, after the reflow of solder ball/bumps in a package assembly, the flux residue remaining in the package assembly needs to be removed. However, when the pitches of the solder ball/bumps become small, the gaps between the solder balls are also small. Therefore, it is difficult for the solvent and water that are used in the cleaning process to flow into and out of the gaps between the solder balls.

In addition, in the conventional package assembly cleaning processes, solvents were sprayed onto the package assemblies. With such a method, the efficiency of the package assembly cleaning process also becomes lower with the reduction in the pitches. It is not feasible to increase the cleaning efficiency by increasing the pressure of the sprayed solvent, since the increased pressure may cause damage to the dies, which may include low-k dielectric layers therein, and hence are prone to the damage of the increased pressure.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 3B are diagrams of intermediate stages in a package assembly cleaning process in accordance with an embodiment;

DETAILED DESCRIPTION OF ILLUSTRATIVE EMBODIMENTS

Figure 3A:
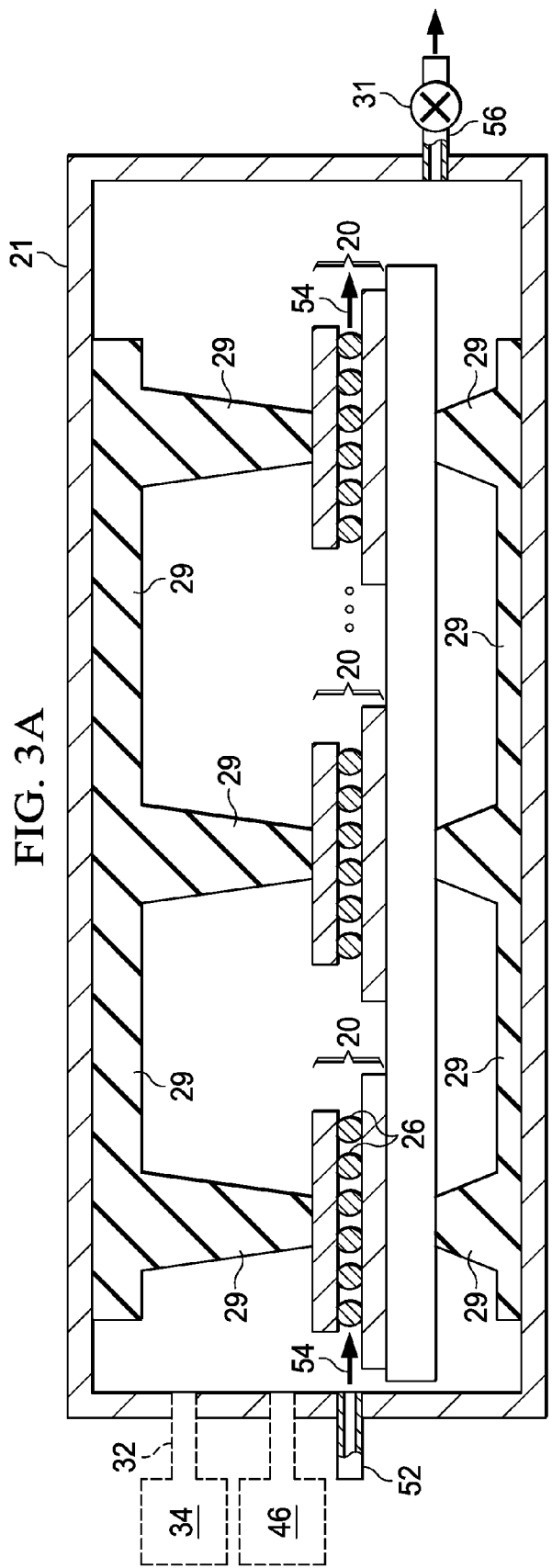

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel package assembly cleaning process and the apparatus for performing the same are provided in accordance with an embodiment. The variations and the operation of the embodiment are discussed. Throughout the various views and illustrative embodiments, like reference numbers are used to designate like elements.

FIGS. 1A through 3B illustrate package assembly cleaning processes in accordance with various embodiments. Referring to FIG. 1A, a plurality of package assemblies 20 are placed in chamber 21. In an embodiment, package assemblies 20 include a plurality of different package components bonded together. For example, the illustrated exemplary package assemblies 20 include package components 22 bonded to package components 24, wherein each of package components 22 and 24 may be a device die, an interposer, a package substrate, a printed circuit board (PCB), and the like. Each of package components 22 and 24 may also be a package comprising a plurality of package components bonded together. The bonding of package components 22 and 24 may be achieved through solder balls/bumps 26, although other kind of bonding mechanisms such as direct metal bonding may also be used.

In an embodiment, the package assembly cleaning process in accordance with the embodiments has the function of cleaning (solder) flux residue, which is schematically illustrated as 27. However, the package assembly cleaning process is not limited to the cleaning of flux, and other undesirable substances such as chemicals may also be removed from package assemblies 20. The solvent used in the package assembly cleaning process is thus selected in accordance with the type of the undesirable substances that is to be removed, and the solvent is capable of dissolving the undesirable substances therein.

In an embodiment, chamber 21 is a sealed chamber, and the pressure in chamber 21 may be increased to greater than 1 atmosphere, such as between 1 atmosphere and about 2 atmospheres. In alternative embodiments, chamber 21 is substantially sealed, and during the package assembly cleaning process, the pressure in chamber 21 is maintained at about 1 atmosphere. Chamber 21 include inlet 30, which is connected to solvent-containing vapor generator 34 through channel 32, which may be a flexible pipe or any other applicable channels. Chamber 21 further includes outlet 56. Pump 31 may be connected to outlet 56.

In a first step of the package assembly cleaning process, solvent-containing vapor 40, which is symbolized by an arrow, is generated by solvent-containing vapor generator 34, and introduced into chamber 21. Solvent-containing vapor 40 may include the vapor of a solvent that can dissolve the undesirable substance. In addition, solvent-containing vapor 40 may include the steam of water. For example, if the flux residue is to be removed, solvent-containing vapor 40 may include the vapor of KOH $C_2H_7NO$ and $C_5H_{10}O_2$, or combinations thereof, in addition to the steam of clean water. The solvent in solvent-containing vapor 40 may range from about 0.1 weight percent and about 20 weight percent, although different weight percents may be used.

During the package assembly cleaning process, solvent-containing vapor 40 that is conducted into chamber 21 enters into the gaps within solder balls/bumps formed on the surfaces of the respective package assemblies 20. To force solvent-containing vapor 40 enters into the gaps between solder balls/bumps 26. Flow-blocker 29 may be placed in chamber 21. As shown in FIGS. 1A and 1B, the shape of flow-blocker 29 is designed to block solvent-containing vapor 40 from being conducted through the paths other than the gaps between solder balls/bumps 26, so that as much as possible solvent-containing vapor 40 flows through the gaps. FIG. 1B illustrates a cross-sectional view of FIG. 1A, wherein the cross-sectional view is obtained from the plane crossing line 1B-1B in FIG. 1A. Solvent-containing vapor 40 may be at the room temperature or at an elevated temperature, such as between about 70° C. and about 90° C., although different temperatures may be used. The first step may be performed for a duration, for example, between about 1 minute and about 15 minutes. The pressure in chamber 21 in the first step may be between about 1 atmosphere and about 2 atmospheres.

Solvent-containing vapor 40 condenses as liquid, and forms micro-drops at the surfaces of package assemblies 20. The micro-drops dissolve flux residue 27, and flows off from package assemblies 20. Accordingly, the undesirable substance such as flux residue 27 is removed along with the liquidized solvent-containing vapor 40, and package assemblies 20 are cleaned. Since solvent-containing vapor 40 has better ability in penetrating into small gaps than liquid solvent that is sprayed on the package assemblies, solvent-containing vapor 40 may be used to remove the undesirable substance from very small gaps efficiently.

In an exemplary cleaning process, solvent-containing vapor 40 is introduced into chamber 21, wherein pump 31 is turned off. Accordingly, since chamber 21 has no outlet, the pressure in chamber 21 increases to greater than one atmosphere, and may be between about one atmosphere and two atmospheres. As a result, solvent-containing vapor 40 enters into the gaps between solder balls/bumps 26, and condenses. Next, pump 31 is turned on to purge the condensed solvent-containing vapor 40, which may be in liquid form with flux residue dissolved therein, or may be in a vapor form, or in a mixed form including liquid and vapor. When pump 31 is turned on, solvent-containing vapor 40 may continue to be introduced into chamber 21. The off-on cycle of pump 31 may be repeated a plurality of times. The first step of the package assembly cleaning process is then finished, and the solvent-containing vapor 40 is stopped from being conducted into chamber 21.

FIG. 2 illustrates a second step of the package assembly cleaning process. Clean water steam 44 is conducted into chamber 21, for example, through inlet 42. In an embodiment, clean water steam 44 is generated by steam generator 46. Clean water steam 44 may be free from the solvent that is used in the first step, and may also be free from any other solvent in some embodiments. The second step may be performed for a duration, for example, between about 1 minute and about 15 minutes. The pressure in chamber 21 in the second step may be between about 0.000001 atmospheres and about 2 atmospheres. Clean water steam 44 may be at the room temperature or at an elevated temperature, such as between about 70° C. and about 90° C., although different temperatures may be used. During the second step of the package assembly cleaning process, clean water steam 44 may condense as water. The residue solvent (that is left on package assemblies 20 in the first step) and any flux that is dissolved in the residue solvent are dissolved in the water. When the condensed water flows off, the residue solvent and the residue flux also flow off package assemblies 20.

FIG. 3A illustrates a third step of the package assembly cleaning process, wherein clean air 54 is conducted into chamber 21, for example, through inlet 52. Although solvent-containing vapor 40 (FIG. 1A), clean wafer vapor 44 (FIG. 2), and clean air 54 (FIG. 3A) are illustrated as being conducted through different inlets, as illustrated using dashed lines in FIG. 3A, they may also be conducted in through the same inlet. The third step may be performed for a duration, for example, between about 1 minute and about 20 minutes. The pressure in chamber 21 in the third step may be between about 0.0000001 atmospheres and about 1 atmosphere. Clean air 54 may be at the room temperature or at an elevated temperature, such as between about 70° C. and about 90° C., although different temperatures may be used. In the third step, the residue water in and on package assemblies 20 is removed.

Figure 3B:
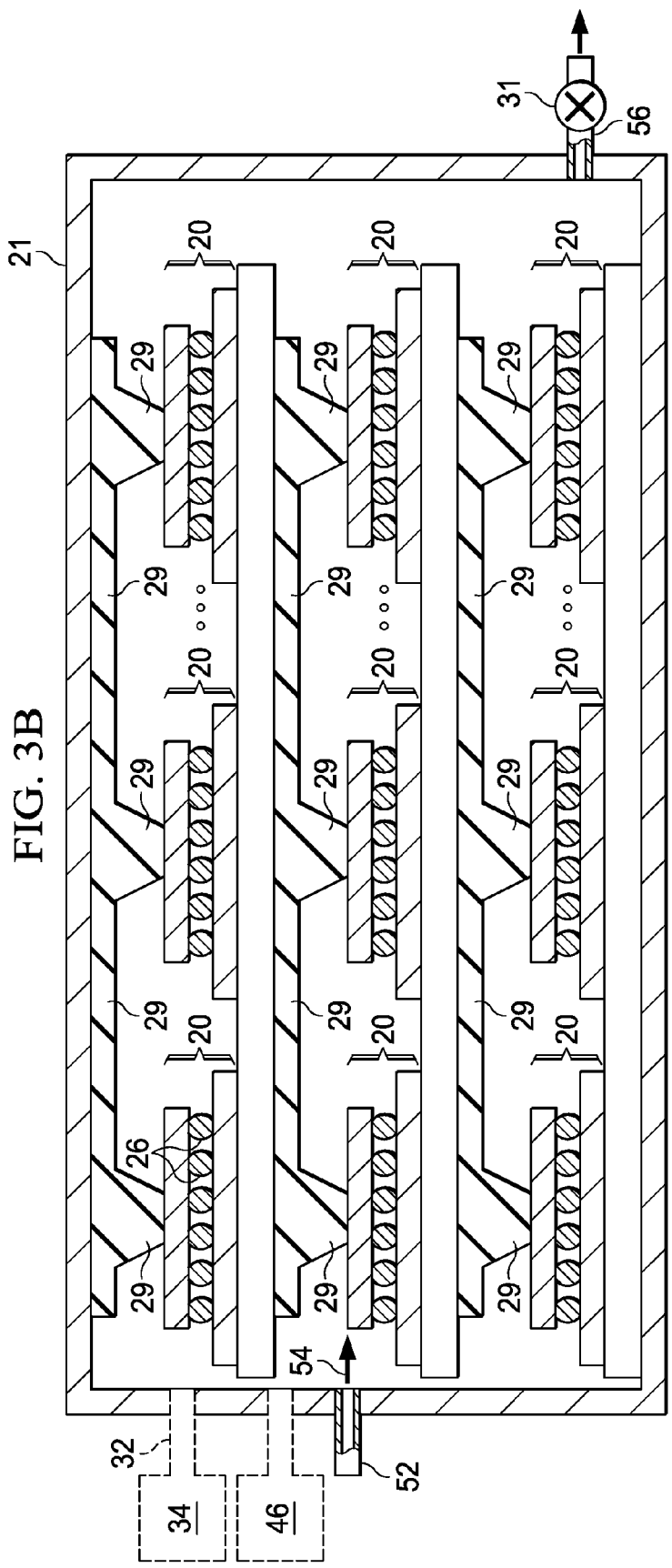

FIG. 3B illustrates an embodiment similar to the embodiment shown in FIG. 3A, wherein a plurality of package assemblies 20 is stacked. Flow-blocker 29 may block the spaces between the stacked package assemblies 20.

During each of the steps as shown in FIGS. 2 and 3A/3B, flow-blocker 29 may be used to force water steam 44 and clean air 54 to flow through the gaps between solder balls/bumps 26. Furthermore, when water steam 44 and/or clean air 54 are introduced, pump 31 may go through off-on cycles, so that the pressure in chamber 21 may be increased to greater than one atmosphere, and may be to between about one atmosphere and about 2 atmospheres, and then reduced.

Figure 4:
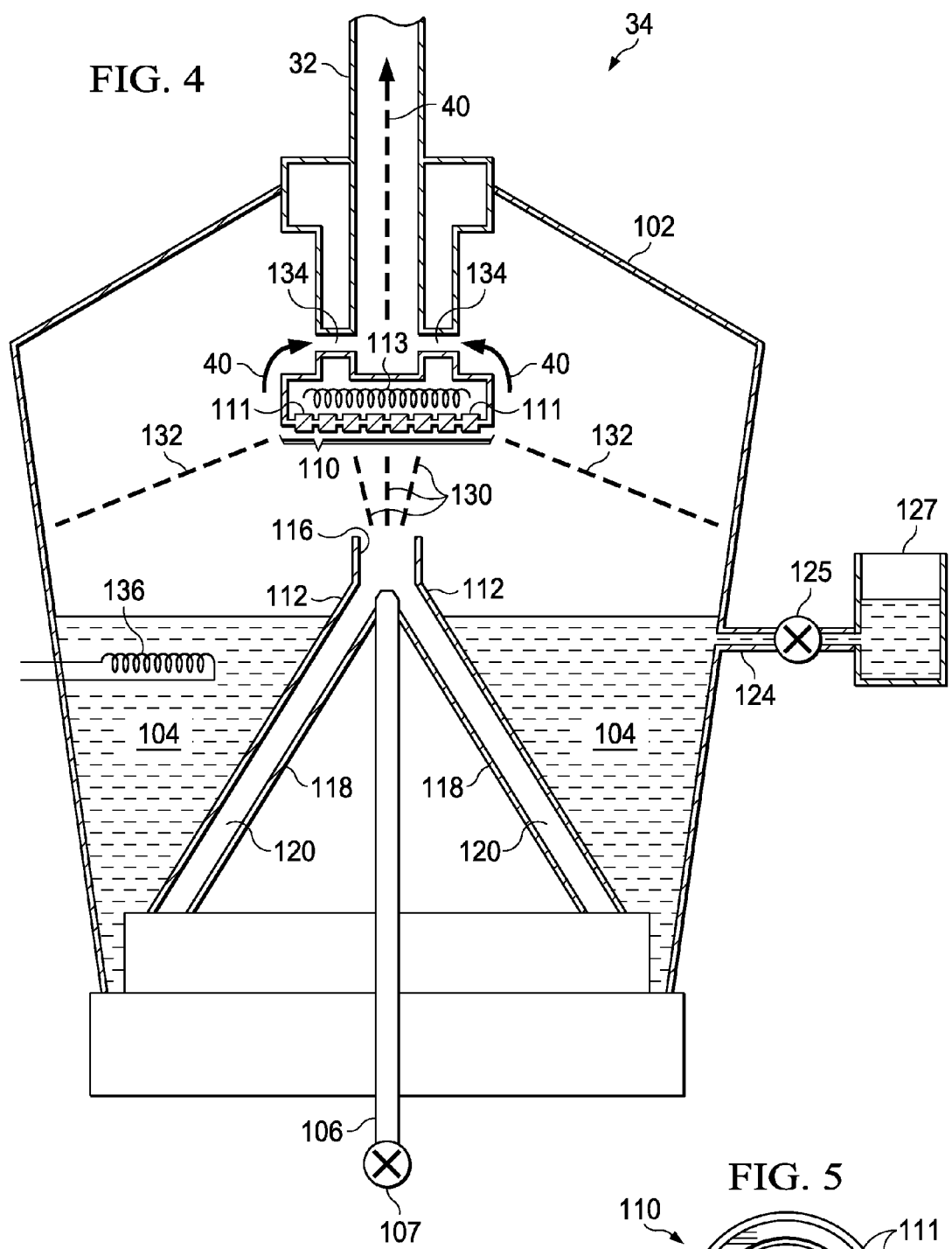
FIG. 4 is a cross-sectional view of a solvent-containing vapor generator in accordance with an embodiment, wherein solvent-containing vapor is generated through vibration.

FIG. 4 illustrates an implementation of solvent-containing vapor generator 34 in accordance with an embodiment. Solvent-containing vapor generator 34 includes chamber 102, in which solvent-containing vapor 40 as in FIG. 1A is generated. Solvent-containing solution 104 is contained in chamber 102. Air-in pipe 106 extends from outside to inside chamber 102, wherein air-in pipe 106 is configured to conduct clean air into chamber 102. Air-in pipe 106 may be connected to air pump 107. Air-in pipe 106 has an outlet facing vibrator 110.

Figure 5:
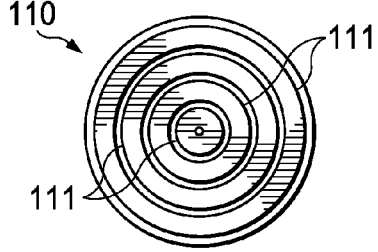
FIG. 5 illustrates a bottom view of a vibrator in the solvent-containing vapor generator.

FIG. 5 illustrates a bottom view of vibrator 110. In an exemplary embodiment, vibrator 110 includes a plurality of protruded portions 111, which may form concentric rings, and a plurality of non-protruded portions between protruded portions 111. Vibrator 110 vibrates when the clean air from air-in pipe 106 (FIG. 4) and the solvent-containing solution 104 are blown toward it. Vibrator 110 may be heated to a temperature between about 95° C. and about 105° C. by heater 113, for example, so that the efficiency in generating solvent-containing vapor 40 is increased.

Referring back to FIG. 4, in an embodiment, outer cone-shape cover 112 has its bottom part submerged in solvent-containing solution 104. The top part of outer cone-shape cover 112 is above the top surface of solvent-containing solution 104. Outer cone-shape cover 112 isolates the component inside the respective cone from solvent-containing solution 104. Top opening 116 of outer cone-shape cover 112 is also above solvent-containing solution 104. Inside outer cone-shape cover 112, there may be inner cone-shape cover 118, wherein space 120 is formed between inner cone-shape cover 118 and outer cone-shape cover 112. Inner cone-shape cover 112 has a top-end opening, and air-in pipe 106 extends through the top-end opening.

Solvent replenish pipe 124 extends from outside to inside chamber 102, and is used to replenish solvent-containing solution 104 that is lost to the generated solvent-containing vapor 40. Solvent replenish pipe 124 may be connected to pump 125 and solvent reservoir 127. In an embodiment, as shown in FIG. 4, solvent replenish pipe 124 may have it end extending directly into, or over, solvent-containing solution 104. In alternative embodiments, solvent replenish pipe 124 may have an end that opens to space 120.

During the solvent-containing vapor generation step, clean air is conducted into air-in pipe 106, and is blown to vibrator 110. The high speed of the air causes the path of the air to have a low pressure, and (as is known according to the Bernoulli's principle) the pressure in the path of the air is low. Accordingly, the replenished solvent-containing solution coming from solvent replenish pipe 124 and solvent-containing solution 104 are attracted to the air, and is also blown to vibrator 110. Dashed lines 130 symbolize the mixture of solvent-containing solution 104 and the air. The impact of solvent-containing solution 104 and the air with vibrator 110 causes solvent-containing droplets 132 to be generated and reflected. Droplets 132 and solvent-containing solution 104 are further vaporized. The resulting solvent-containing vapor 40 passes through paths 134, and is conducted to pipe 32, which is further connected to chamber 21 as in FIG. 1A.

In an embodiment, the solvent in solvent-containing solution 40 is selected so that it has a boiling temperature close to the boiling temperature of water. For example, the boiling temperature of the solvent may be between about 95° C. and about 105° C. Accordingly, in solvent-containing vapor 40, the ratio of the weight percentage of the solvent to the weight percentage of water may be substantially the same as the desirable ratio of the weight percentage of the solvent to the weight percentage of water in solvent-containing solution 104. During the generation of solvent-containing vapor 40, solvent-containing solution 104 may also be heated to increase the vapor generation rate, wherein the temperature of solvent-containing solution 104 may be heated to, for example, between about 70° C. and about 80° C. Solvent-containing solution 104 may be heated, for example, by heater 136 that is built in solvent-containing solution 104.

Figure 6:
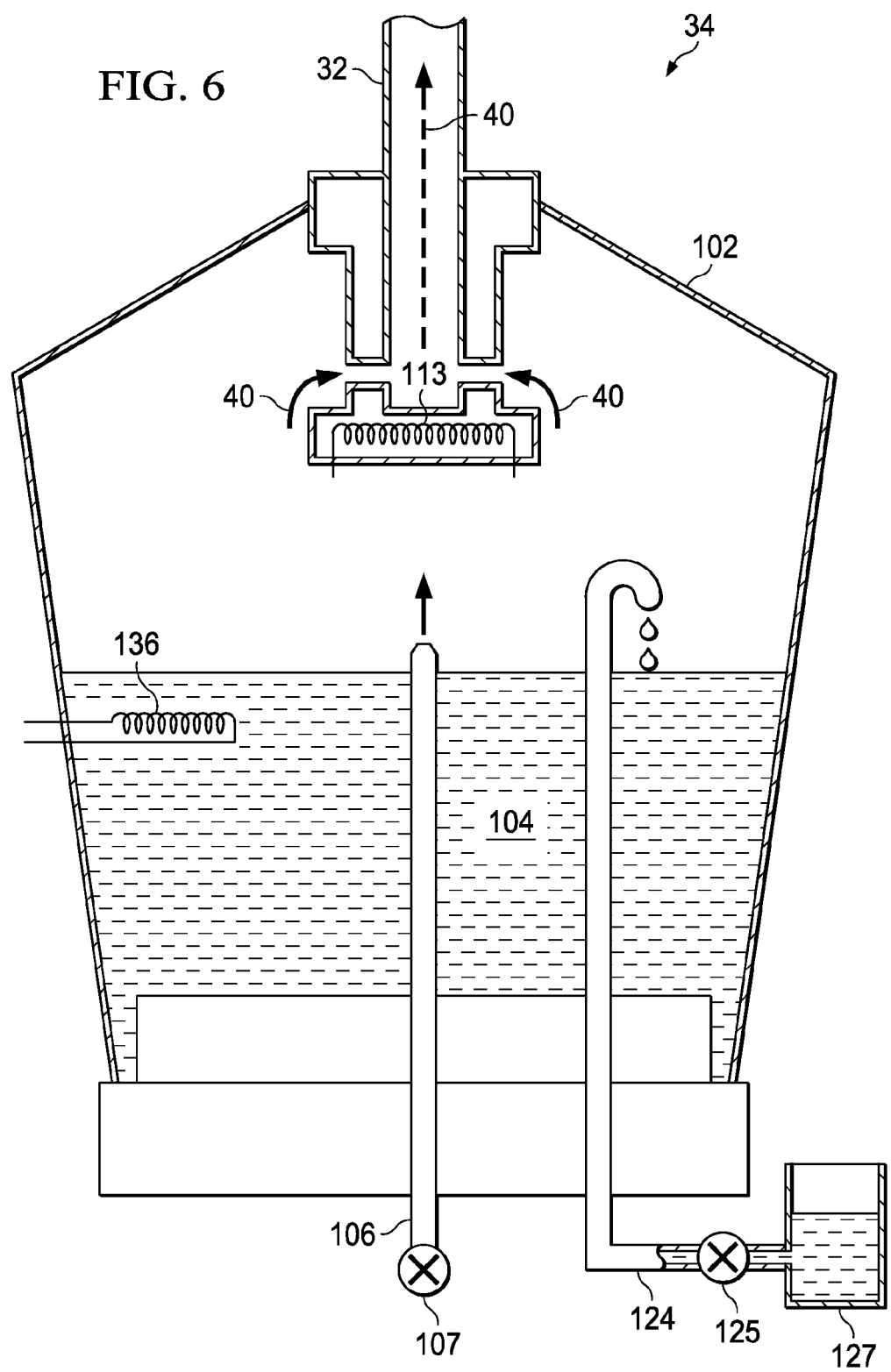
FIGS. 6 and 7 are cross-sectional views of solvent-containing vapor generators in accordance with alternative embodiments, wherein the solvent-containing vapor is generated using a heater and an ultrasonic generator, respectively.

FIG. 6 illustrates solvent-containing vapor generator 34 in accordance with alternative embodiments. Unless specified otherwise, the reference numerals in these embodiments represent like elements in the embodiments illustrated in FIGS. 1A through 4. Vapor 40 in accordance with these embodiments is generated by heating solvent-containing solution 104, for example, using heater 136. In an embodiment, solvent-containing solution 104 is heated to between about 90° C. and about 100° C., although higher or lower temperatures may be used. Heater 113 is built in solvent-containing vapor generator 34, and may be located close to channel 32, so that the efficiency in generating solvent-containing vapor 40 is increased. This embodiment may also include air-in pipe 106 for conducting clean air, which may be used to increase the pressure in chamber 102, so that the generated solvent-containing vapor 40 may be blown into chamber 21 in FIG. 1A. Also, solvent replenish pipe 124 is used to replenish solvent-containing solution 104 that is lost to solvent-containing vapor 40.

Figure 7:
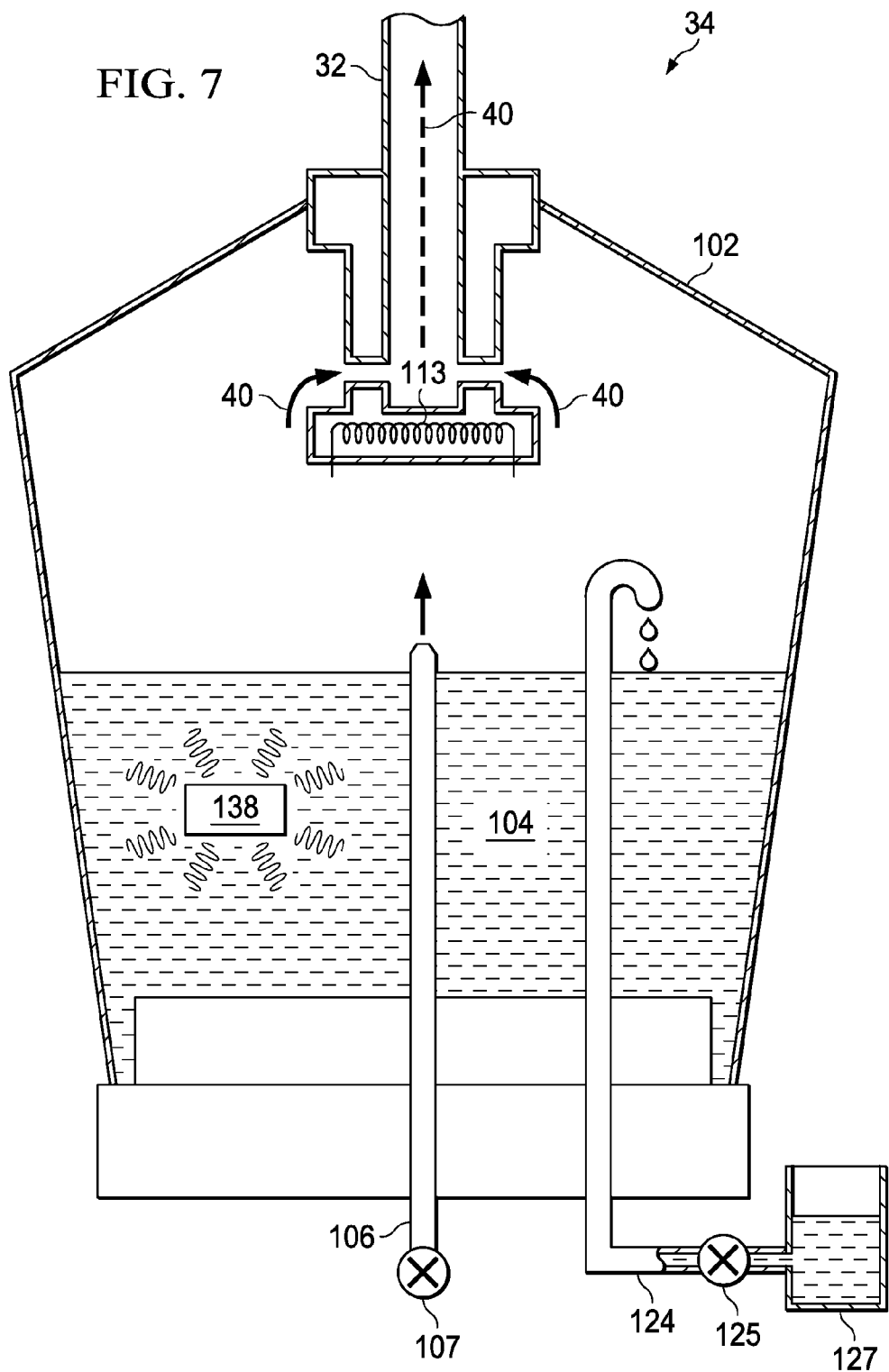

FIG. 7 illustrates solvent-containing vapor generator 34 in accordance with yet other embodiments. The solvent-containing vapor 40 in accordance with these embodiments are generated by using ultrasonic generator 138, which generates the ultra sound that provides the energy for vaporizing solvent-containing solution 104. These embodiments may also include air-in pipe 106 for conducting clean air, which is used to increase the pressure in chamber 102. Also, solvent replenish pipe 124 is used to replenish the solvent-containing solution 104 that is lost to solvent-containing vapor 40. Heater 113 is built in solvent-containing vapor generator 34, and may be located close to channel 32, so that the efficiency in generating solvent-containing vapor 40 is increased.

In yet other embodiments, two or more of the vibration, heat, and ultrasound as in FIGS. 4 through 7 may be combined to generate solvent-containing vapor 40. The respective apparatus may be realized by combining the respective components as shown FIGS. 4 through 7.

In the embodiments, the cleaning of package assemblies is performed by conducting the solvent-containing vapor into sealed chambers, in which the package assemblies are placed. Accordingly, the solvents, which are in the vapor form, can penetrate into very small gaps, and hence the package assemblies with fine-pitch bumps may be cleaned efficiently.

In accordance with embodiments, a method includes generating a solvent-containing vapor that contains a solvent. The solvent-containing vapor is conducted to a package assembly to clean the package assembly. The solvent-containing vapor condenses to form a liquid on a surface of the package assembly, and flows off from the surface of the package assembly.

In accordance with other embodiments, a method includes placing a plurality of package assemblies into a chamber, and conducting a solvent-containing vapor comprising a solvent and water steam into the chamber. During the step of conducting the solvent-containing vapor, a pump may be turned on and off for a plurality of cycles. The solvent-containing vapor condenses as a liquid in the chamber. The solvent in the liquid is capable of dissolving solder flux. After the step of conducting the solvent-containing vapor, a clean water vapor is conducted into the chamber.

In accordance with yet other embodiments, an apparatus includes a solvent-containing vapor generation chamber, which is configured to contain a solvent-containing solution. A first pipe extends from outside to inside the solvent-containing vapor generation chamber, wherein the first pipe is configured to replenish the solvent-containing solution into the solvent-containing vapor generation chamber. The solvent-containing vapor generation chamber further includes an outlet. The apparatus further includes a chamber configured to have a plurality of package assemblies placed therein, wherein the chamber has an inlet, and is capable of being sealed. A channel connects the outlet of the solvent-containing vapor generation chamber to the inlet of the chamber.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   generating a solvent-containing vapor, wherein the solvent-containing vapor comprises a solvent;
   conducting the solvent-containing vapor to a package assembly to clean the package assembly, wherein the solvent-containing vapor condenses to form a liquid on a surface of the package assembly, and wherein the step of conducting the solvent-containing vapor to the package assembly comprises:
      placing the package assembly in a sealed chamber; and
      conducting the solvent-containing vapor into the sealed chamber; and
   after the step of conducting the solvent-containing vapor into the chamber, conducting a clean water vapor into the chamber.

2. The method of claim 1, wherein during the step of conducting the solvent-containing vapor into the sealed chamber, a pressure of the solvent-containing vapor in the chamber is greater than 1 atmosphere.

3. The method of claim 1 further comprising, after the step of conducting the clean water vapor into the chamber, conducting clean air into the chamber.

4. The method of claim 1, wherein the solvent is capable of dissolving solder flux, and wherein the package assembly comprises solder flux residue.

5. The method of claim 1 further comprising:
replenishing a solvent-containing solution in a vapor generation chamber, wherein the solvent-containing solution comprises the solvent and water; and
blowing the solvent-containing solution and air to a vibrator to generate solvent-containing droplets and the solvent-containing vapor, wherein the solvent-containing vapor is conducted through a pipe to the package assembly.

6. The method of claim 1 further comprising purging the solvent-containing vapor from a chamber containing the package assembly using a pump, wherein the pump is operated with a plurality of off-on cycles.

7. The method of claim 1, wherein during the step of conducting the solvent-containing vapor, the solvent-containing vapor is forced to flow through the package assembly by a flow-blocker.

8. A method comprising:
placing a plurality of package assemblies into a chamber;
conducting a solvent-containing vapor comprising a solvent and water steam into the chamber, wherein during the step of conducting the solvent-containing vapor, the chamber is sealed, and the solvent-containing vapor is not discharged out of the chamber, and wherein the solvent-containing vapor condenses as a liquid in the chamber, with the solvent in the liquid capable of dissolving solder flux; and
after the step of conducting the solvent-containing vapor, conducting a clean water vapor into the chamber.

9. The method of claim 8, wherein the plurality of package assemblies comprises solder balls bonding package component together, and residue solder flux on the solder balls.

10. The method of claim 8, wherein the solvent and water have boiling temperatures close to each other.

11. The method of claim 8, wherein during the step of conducting the solvent-containing vapor into the chamber, a pressure of the solvent-containing vapor in the chamber is greater than two atmospheres.

12. The method of claim 8 further comprising, after the step of conducting the clean water vapor into the chamber, conducting clean air into the chamber.

13. The method of claim 8 further comprising:
supplying a solvent-containing solution into a vapor generation chamber, wherein the solvent-containing solution comprises the solvent; and
blowing the solvent-containing solution and air to a vibrator to generate solvent-containing droplets and the solvent-containing vapor, wherein the solvent-containing vapor is conducted through a pipe to into the chamber.

14. The method of claim 8 further comprising generating the solvent-containing vapor by heating a solvent-containing solution, wherein the solvent-containing solution comprises the solvent and water.

15. The method of claim 8 further comprising generating the solvent-containing by providing an ultrasonic to a solvent-containing solution, wherein the solvent-containing solution comprises the solvent and water.

16. A method comprising:
placing a package assembly into a chamber;
with the package assembly in the chamber, conducting a solvent-containing vapor comprising a solvent and water steam into the chamber, wherein during conducting the solvent-containing vapor, a pressure of the solvent-containing vapor in the chamber increases with time, wherein during the conducting, the solvent-containing vapor condenses as a liquid in the chamber, with a solder flux in the package assembly dissolved in the liquid; and
after the step of conducting the solvent-containing vapor, discharging the solvent-containing vapor from the chamber.

17. The method of claim 16, wherein during the conducting, the pressure of the solvent-containing vapor in the chamber increases to higher than about 2 atmospheres.

* * * * *